United States Patent
Ohshima

(10) Patent No.: US 6,441,679 B1
(45) Date of Patent: Aug. 27, 2002

(54) SEMICONDUCTOR ACTIVE FUSE OPERATING AT HIGHER SUPPLY VOLTAGE EMPLOYING CURRENT OSCILLATION

(75) Inventor: Shunzou Ohshima, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/619,646

(22) Filed: Jul. 19, 2000

(30) Foreign Application Priority Data

Feb. 14, 2000 (JP) ........................................ 2000-035995

(51) Int. Cl.[7] .............................. G05F 1/10; G05F 3/02
(52) U.S. Cl. ........................................ 327/538; 323/282
(58) Field of Search ................................ 327/538, 540, 327/541, 543; 323/282, 283

(56) References Cited

FOREIGN PATENT DOCUMENTS

| JP | 1-26250 | 5/1989 |
|---|---|---|
| JP | 1-227520 | 9/1989 |
| JP | 2-266826 | 10/1990 |
| JP | 2-266836 | 10/1990 |
| JP | 3-262209 | 11/1991 |
| JP | 4-134271 | 5/1992 |
| JP | 6-61432 | 3/1994 |
| JP | 6-188704 | 7/1994 |
| JP | 6-244693 | 9/1994 |
| JP | 2527875 | 6/1996 |
| JP | 2570523 | 10/1996 |
| JP | 9-145749 | 6/1997 |

*Primary Examiner*—Terry D. Cunningham
*Assistant Examiner*—Quan Tra
(74) *Attorney, Agent, or Firm*—Finnegan, Henderson, Farabow, Garrett, & Dunner, L.L.P.

(57) ABSTRACT

A high-voltage semiconductor active fuse has first and second semiconductor elements, a comparator for comparing the voltages of the first and second semiconductor elements with each other, a driver for supplying a control voltage to the control electrodes of the first and second semiconductor elements according to the output of the comparator, a first diode connected between a first input terminal of the comparator and a low-potential power supply terminal of the comparator, and a second diode connected between a second input terminal of the comparator and the low-potential power supply terminal through a resistor. When detecting an abnormal current, the active fuse turns on and off the first semiconductor element to cause current oscillations, which blocks the conduction between an external input terminal and an external output terminal. The active fuse needs no shunt resistor and is capable of quickly responding to an abnormal current caused by an incomplete short circuit failure.

10 Claims, 8 Drawing Sheets

SEMICONDUCTOR ACTIVE FUSE OPERATING AT HIGHER SUPPLY VOLTAGE EMPLOYING CURRENT OSCILLATION

BACKGROUND OF THE INVENTION

1. Field of the Invention

The present invention relates to a semiconductor active fuse, and particularly, to a semiconductor active fuse appropriate for a high-voltage power supply controller.

2. Description of the Related Art

FIG. 1 shows an example of a power supply controller according to a related art. This power supply controller employs a transistor QF having a temperature sensor, for selectively controlling the supply of power from a power supply 101, such as a battery of a vehicle, to a load 102. In the example of FIG. 1, the power supply 101 is of a 12-V system and supplies a voltage VBp. The power supply 101 is connected to an end of a shunt resistor RS. The other end of the shunt resistor RS is connected to a drain terminal D of the transistor QF. A source terminal S of the transistor QF is connected to the load 102, which may be a headlight or a power-window driving motor. The power supply controller further has a control circuit 901, an A/D converter 902, and a microcomputer (CPU) 903. The control circuit 901 detects a current passing through the shunt resistor RS and controls the transistor QF through hardware circuits. The A/D converter 902 and microcomputer 903 turn on and off a drive signal for the transistor QF according to the current monitored by the control circuit 901. The transistor QF has a thermal protection function for forcibly turning off the transistor QF through an incorporated gate turn-off circuit. When detecting that the temperature of the transistor QF is above a specified temperature, the temperature sensor in the transistor QF informs the gate turn-off circuit of the high temperature, and the gate turn-off circuit forcibly turns off the transistor QF.

A Zener diode ZD1 keeps a voltage of 12 V between the gate terminal G and source terminal S of the transistor QF, and protecting an overvoltage breakdown, bypassing between the true gate TG and the source terminal of the transistor QF. The control circuit 901 includes differential amplifiers 911 and 913 serving as a current monitor circuit, a differential amplifier 912 serving as a current limiter, a charge pump 915, and a driver 914. The driver 914 receives an ON/OFF control signal from the microcomputer 903 and an overcurrent signal from the current limiter 912 and drives the gate G of the transistor QF through an internal resistor RG (not shown) accordingly. The differential amplifier 912 uses a voltage drop occurring at the shunt resistor RS to detect a current flowing to the transistor QF. If the detected current is an overcurrent above an upper threshold, the differential amplifier 912 instructs the driver 914 to turn off the transistor QF. Once the detected current becomes below a lower threshold, the differential amplifier 912 instructs the driver 914 to turn on the transistor QF. The microcomputer 903 always monitors a current through the current monitor circuit made of the differential amplifiers 911 and 913. Upon detecting an abnormal current exceeding a normal level, the microcomputer 903 issues an OFF signal to the transistor QF to turn off the transistor QF. If the temperature of the transistor QF exceeds a predetermined level before the microcomputer 903 issues the OFF signal, the thermal protection function turns off the transistor QF.

To detect a current, the related art must have the shunt resistor RS in a power supply line. If a current flowing through the shunt resistor RS is large, the shunt resistor RS will cause a large heat loss that is not ignorable.

The thermal protection function and overcurrent control circuit of the related art may work on a dead short that occurs in the load 102 or wiring to produce a large current. However, the related art unsatisfactorily works on an incomplete short circuit failure such as a layer short having a certain extent of short-circuit resistance to produce only a weak short-circuit current. Only way for the related art to cope with such an incomplete short circuit failure is to detect an abnormal current caused by the short circuit failure with the use of the microcomputer 903 and current monitor circuit and turn off the transistor QF by the microcomputer 903. The microcomputer 903, however, is slow to respond to such an abnormal current.

The shunt resistor RS, A/D converter 902, and microcomputer 903 that are imperative for the related art need a large space and are expensive, to increase the size and cost of the power supply controller. When applied for a high-voltage power line, the microcomputer 903 must be protected from the high voltage, to further increase the size and cost of the power supply controller.

At present, power supply systems for vehicles are mainly of 12 volts. For the 12-V power supply system, it is sufficient to consider a maximum supply voltage of about 18 V. To reduce a power loss due to a load current, it is studied to increase the power supply system to 42 volts. To meet the 42-V supply voltage, the transistor QF and control circuit 901 must have a higher breakdown voltage.

If the supply voltage is increased to 42 V, the differential amplifiers 911 to 913 and driver 914 of the related art of FIG. 1 must also have an increased breakdown voltage. The elements 911 to 914 are manufactured through CMOS processes or BiCMOS processes, and these processes must be modified to increase the breakdown voltage of the elements. Increasing the breakdown voltage of a given device is achievable by increasing the number of elements having the same breakdown voltage, thickening a gate insulating film, or forming a guard ring or a field plate for improving the breakdown voltage of each element. The technique of increasing the number of elements having the same breakdown voltage increases a chip area and complicates manufacturing processes to increase costs. The technique of thickening a gate insulating film deteriorates the electric characteristics such as transconductance $g_m$ of each semiconductor element. In addition, operating the semiconductor elements under a high voltage deteriorates the reliability of the semiconductor elements.

It is advantageous, in terms of costs and reliability, if the control circuit 901 can still employ 12-V elements even if a higher supply voltage is introduced.

SUMMARY OF THE INVENTION

An object of the present invention is to solve the problems of the related art mentioned above and provide a semiconductor active fuse capable of quickly coping with an abnormal current caused by an incomplete short circuit failure such as a layer short without a shunt resistor.

Another object of the present invention is to provide a semiconductor active fuse capable of employing conventional 12-V elements for a comparator for comparing the potentials of the second main electrodes of first and second semiconductor elements with each other even if a 12-V power supply system is increased to, for example, a 42-V power supply system.

Still another object of the present invention is to provide a semiconductor active fuse capable of operating with a control circuit that employs a comparator of a conventional breakdown voltage, thereby avoiding a cost increase to be involved in increasing the breakdown voltage of the comparator.

Still another object of the present invention is to provide a semiconductor active fuse of improved reliability realized by a comparator of a control circuit that operates under a standard voltage, not requiring the bias condition for higher supply voltage.

In order to accomplish the objects, the present invention provides a semiconductor active fuse having a first semiconductor element that has a first main electrode connected to a DC power supply, a second main electrode connected to a load, and a control electrode, a second semiconductor element that has a first main electrode connected to the first main electrode of the first semiconductor element, a second main electrode connected to a reference circuit, and a control electrode connected to the control electrode of the first semiconductor element, a comparator that has a high-potential power supply terminal, a low-potential power supply terminal, a first input terminal connected to the second main electrode of the first semiconductor element, and a second input terminal connected to the second main electrode of the second semiconductor element, a driver for supplying a control voltage to the control electrodes of the first and second semiconductor elements according to the output of the comparator, a first diode connected between the first input terminal and the low-potential power supply terminal, and a second diode connected between the second input terminal and the low-potential power supply terminal through a resistor. If an overcurrent that is above a reference current determined by the reference circuit flows through the first semiconductor element, the active fuse turns on and off the first semiconductor element to produce current oscillations that cut off the conductive state of the first semiconductor element. The reference circuit may be a reference resistor, a constant current source, a parallel circuit of a resistor and a constant current source, or any other else. The high-potential power supply terminal is kept at a system supply voltage, and a voltage between the high-potential power supply terminal and the low-potential power supply terminal is kept at a voltage that is lower than the system supply voltage. The first and second semiconductor elements may be MOS transistors such as MOS field effect transistors (FETs) or MOS static induction transistors (SITs), or insulated gate power semiconductor elements such as insulated gate bipolar transistors (IGBTs). Alternatively, the first and second semiconductor elements may be MOS composite semiconductor elements such as emitter switched thyristors (ESTs). The first and second semiconductor elements are any one of n- and p-channel types. The first main electrode is any one of the emitter and collector electrodes of the IGBT, or any one of the source and drain electrodes of the MOS transistor. The second main electrode is the other of the emitter and collector electrodes, or the other of the source and drain electrodes. More precisely, if the first main electrode is the emitter electrode, the second main electrode is the collector electrode. If the first main electrode is the source electrode, the second main electrode is the drain electrode. The control electrode is the gate electrode of the IGBT or the MOS transistor.

Even if the 12-V power supply system is improved to, for example, the 42-V power supply system, the semiconductor active fuse of the present invention is capable of using 12-V elements for a comparator for comparing the potentials of the second main electrodes of the first and second semiconductor elements with each other. Namely, the present invention needs no increase in the breakdown voltage of the comparator, and therefore, no increase in the cost thereof.

In addition, the semiconductor active fuse of the present invention improves the reliability thereof by avoiding the use of the comparator under the higher voltage conditions.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1:
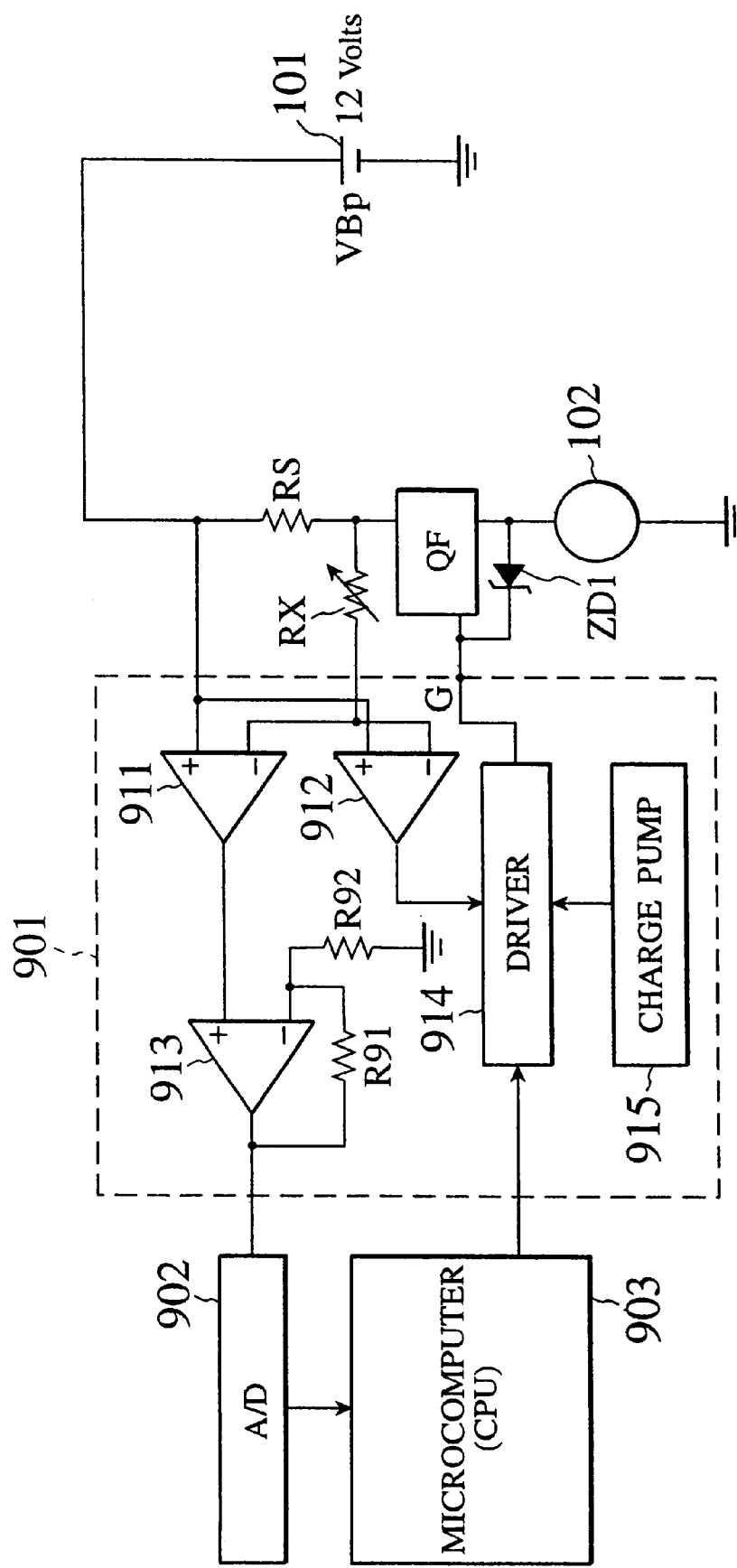
FIG. 1 is a circuit diagram showing the power supply controller according to the related art.

Various embodiments of the present invention will be described with reference to the accompanying drawings. It is to be noted that the same or similar reference numerals are applied to the same or similar parts and semiconductor elements throughout the drawings, and the description of the same or similar parts and semiconductor elements will be omitted or simplified. In the following description, numerous specific details are set fourth such as specific signal values to provide a thorough understanding of the present invention. However, it will be obvious to those skilled in the art that the present invention may be practiced without such specific details. In other instances, well-known circuits are shown in block diagram form in order not to obscure the present invention in unnecessary detail.

A power supply controller examined and investigated as a comparative example to develop the present invention will be explained first. Thereafter, semiconductor active fuses according to the first and second embodiments of the present invention will be explained.

COMPARATIVE EXAMPLE

Figure 2:
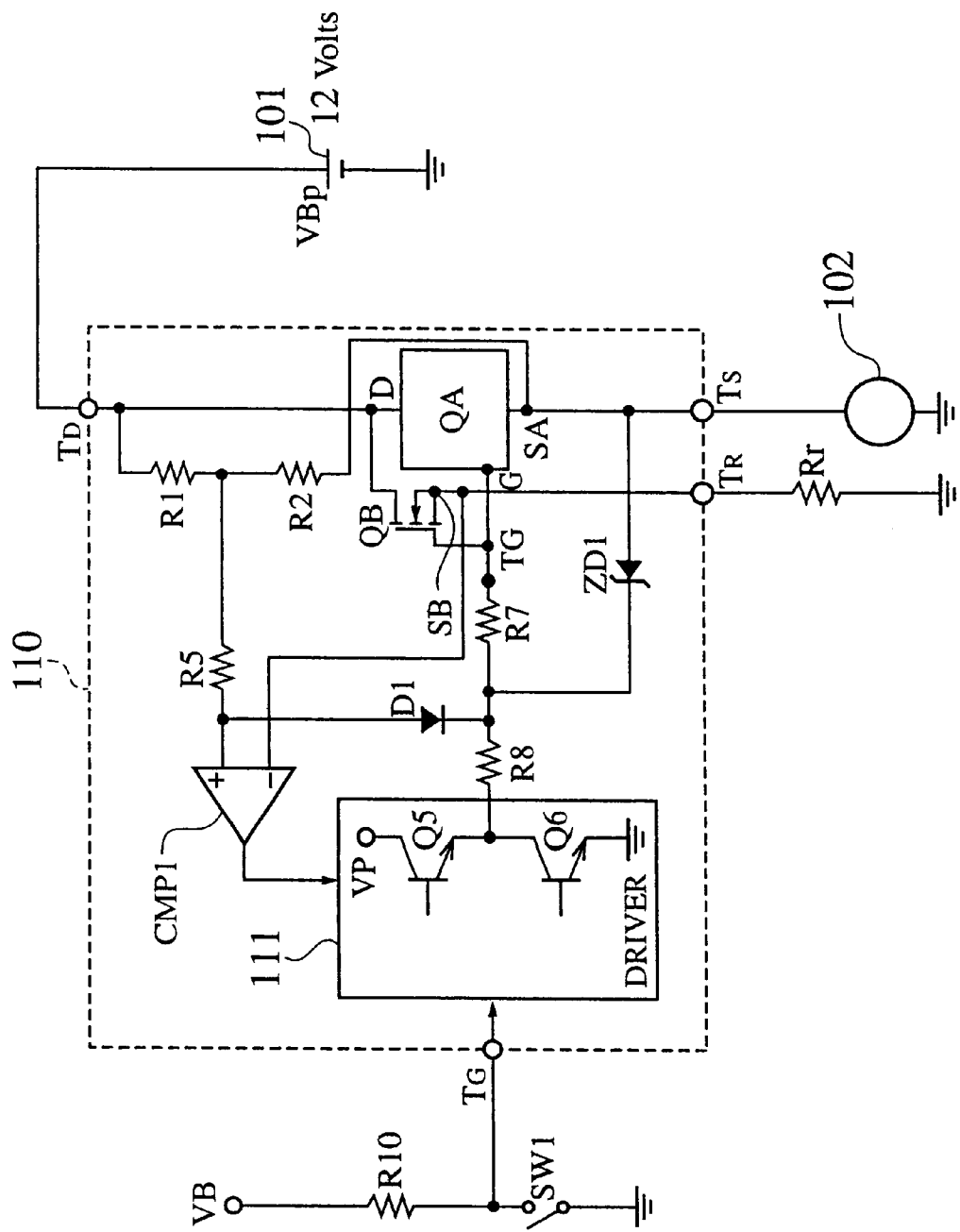
FIG. 2 is a circuit diagram showing a power supply controller of a comparative example.

FIG. 2 shows a power supply controller employing a main semiconductor element QA. The main semiconductor element QA has a temperature sensor and selectively controls the supply of power from a power supply 101 of 12-V system to a load 102. The power supply 101 is, for example, a battery to provide an output voltage VBp of 12-V. The power supply 101 is connected to a drain terminal D of the main semiconductor element QA. A source terminal SA of the main semiconductor element QA is connected to the load 102, which is, for example, a headlight, a taillight, a wiper motor, a power-window motor, or any other vehicle part.

The power supply controller of FIG. 2 has a function of detecting an overcurrent and protecting from the overcurrent. The main semiconductor element QA is connected to the load 102 through a terminal TS. The main semiconductor element QA is connected to a reference semiconductor element QB in parallel with each other. The reference semiconductor element QB is connected to a resistor Rr through a terminal TR. A load current flowing through the main semiconductor element QA generates a drain-source voltage of the main semiconductor element QA. The resistor Rr determines a drain-source voltage of the reference semiconductor element QB. These drain-source voltages are compared with each other by a comparator CMP1, to always check to see if an overcurrent exceeding an overcurrent threshold is present. If there is an overcurrent, a driver 111 is controlled to turn on and off the main and reference semiconductor elements QA and QB, to turn off the main semiconductor element QA after a predetermined continuation of the ON and OFF operations, thereby preventing the burning of wiring and semiconductor elements due to the overcurrent.

In the power supply controller for 12-V system of FIG. 2, each of the main and reference semiconductor elements QA and QB consists of unit cells that are nMOS transistors having the same characteristics and structure. More precisely, the main semiconductor element QA consists of N1 unit cells, and the reference semiconductor element QB N2 unit cells with N1>>N2. In this example, N1:N2 is 1000:1. The drain electrode D of the main semiconductor element QA is connected to the drain electrode DB of the reference semiconductor element QB, and the gate electrodes of the semiconductor elements QA and QB are connected to each other. The source electrode SB of the reference semiconductor element QB is connected to the terminal TR, which is connected to the resistor Rr. The resistor Rr may be a constant current circuit, or a parallel circuit of a constant current circuit and a resistor.

An area defined with a dotted line in FIG. 2 indicates a single semiconductor chip 110 serving as a 12-V monolithic power IC. Outside the chip 110, there is a switch SW1 connected between a resistor R10 and a ground GND. The resistor R10 is connected to the power supply VBp. Potential at a node between the resistor R10 and the switch SW1 is applied to the driver 111 in the chip 110. There is a charge pump (not shown) to provide a stepped-up voltage VP. When the switch SW1 is closed, the driver 111 applies the stepped-up voltage VP to the gates of the main and reference semiconductor elements QA and QB, to turn on these semiconductor elements QA and QB. For example, VP=VBp+10 V where VBp is the power supply voltage.

Each unit cell, i.e., a MOS transistor of the main and reference semiconductor elements QA and QB has an ON resistance value of $R_{fet}$, and the semiconductor elements QA and QB have ON resistance values of $R_{onA}$ and $R_{onB}$, respectively. In an ohmic region where the semiconductor elements QA and QB are completely ON, the following are established:

$$R_{onA}=R_{fet}/N1 \quad (1)$$

$$R_{onB}=R_{fet}/N2 \quad (2)$$

$$R_{onA}=R_{onB}(N2/N1)=R_{onB}/1000 \quad (3)$$

The ON resistance value $R_{onA}$ of the main semiconductor element QA is usually about 30 mΩ. Then, the ON resistance value $R_{onB}$ of the reference semiconductor element QB is 30Ω.

It is assumed that the reference resistor Rr has a resistance value of 2.4 kΩ, the main semiconductor element QA has a drain current of $I_{DA}$, the reference semiconductor element QB has a drain current of $I_{DB}$, and the supply voltage VBp is 12 V. Then, the following are established:

$$\begin{aligned}I_{DB} &= 12\ [V]/(R_{onB}+Rr) \\ &\approx 12\ [V]/Rr \\ &= 12\ [V]/2.4\ [k\Omega] = 5\ [mA]\end{aligned} \quad (4)$$

Assuming that the main and reference semiconductor elements QA and QB have drain-source voltages of $V_{DSA}$ and $V_{DSB}$, respectively, the following are established:

$$V_{DSB}=R_{onB}\times I_{DB}=30[\Omega]\times 5[mA]=0.15\ [V] \quad (5)$$

$$V_{DSA}=R_{onA}\times I_{DA}=30[m\Omega]\times I_{DA} \quad (6)$$

$$V_{DSA}-V_{DSB}=30[m\Omega](I_{DA}-5[A]) \quad (7)$$

If $I_{DA}=5$ [A], then $V_{DSB}=V_{DSA}$. If $I_{DA}<5$ [A], then $V_{DSA}<V_{DSB}$. If $I_{DA}>5$[A], then $V_{DSA}>V_{DSB}$.

Based on the system supply voltage VBp of 12 V, voltages to positive and negative input terminals of the comparator CMP1 will be studied. The negative input terminal of the comparator CMP1 receives the drain-source voltage $V_{DSB}$ of the reference semiconductor element QB, and the positive input terminal thereof receives a voltage that is provided by dividing the drain-source voltage of the main semiconductor element QA by resistors R1 and R2. Assuming that the resistor R1 provides a voltage drop of $V_{R1}$, the following is established:

$$V_{R1}=V_{DSA}\times(R1/(R1+R2)) \quad (8)$$

This voltage $V_{R1}$ is applied to the positive input terminal of the comparator CMP1. A voltage $V_{DSAth}$ that makes $V_{R1}=V_{DSB}$ provides the following:

$$V_{DSB}=V_{DSAth}\times(R1/(R1+R2)) \quad (9)$$

$$V_{DSAth}-V_{DSB}=(R2/R1)\times V_{DSB} \quad (10)$$

In this embodiment, $V_{DSA}=V_{DSB}$ if $I_{DA}=5$[A] according to the expression (1), and the expression (8) provides $V_{DSA}>V_{R1}$. Namely, $V_{R1}<V_{DSB}$.

If $V_{R1}<V_{DSB}$, the output of the comparator CMP1 is high to turn on a source transistor Q5 and off a sink transistor Q6 in the driver 111. As a result, the output voltage VP of the charge pump is applied to the gates of the main and reference semiconductor elements QA and QB, to turn on the semiconductor elements QA and QB.

If $V_{DSA}$ becomes greater than $V_{DSB}$ and $V_{DSAth}$ of the expression (10), then $V_{R1}>V_{DSB}$. At this time, $I_{DA}$ is greater than 5[A] to cause an overcurrent state. The output of the comparator CMP1 becomes low to turn off the source transistor Q5 and on the sink transistor Q6 in the driver 111. This grounds the gates of the main and reference semiconductor elements QA and QB, to turn off these semiconductor elements QA and QB. Then, $V_{DSA}$ and $V_{DSB}$ increase, and $I_{DA}$ and $I_{DB}$ decrease to decrease the difference between $V_{DSA}$ and $V_{DSB}$. As is apparent from the expression (10), the difference $V_{DSAth}-V_{DSB}$ rapidly increases as $V_{DSB}$ increases. Accordingly, $V_{R1}<V_{DSB}$ is again established as $V_{DSA}$ and $V_{DSB}$ increase. Then, the output of the comparator CMP1 becomes high to turn on the main and reference semiconductor elements QA and QB. Namely, in the overcurrent state, the main and reference semiconductor elements QA and QB are alternately turned on and off. The repetitions of the ON and OFF operations activate the thermal protection function of the temperature sensor provided for the main semiconductor element QA, to turn off the main semiconductor element QA. Instead, the duration of the ON and OFF repetitions may be measured with a timer to turn off the main semiconductor element QA. In this way, if a load current flowing through the main semiconductor element QA is below a threshold, the 12-V power supply controller of FIG. 2 keeps an ON state of the main semiconductor element QA to supply power to the load 102. If an overcurrent exceeding a threshold flows through the main semiconductor element QA, the power supply controller turns off the main semiconductor element QA after a predetermined period of time, to prevent the burning of wiring and the power supply controller itself due to the overcurrent.

The power supply controller of the comparative example of FIG. 2 detects a current by comparing the source potential of the main semiconductor element QA with the source potential of the reference semiconductor element QB with the use of the comparator CMP1. The positive and negative input terminals of the comparator CMP1 receive the source potentials of the semiconductor elements QA and QB, respectively. The source potentials of the semiconductor elements QA and QB vary within the range of the supply voltage VBp. The source potential of the main semiconductor element QA may exceed the range of the supply voltage VBp due to the inductance of a line where a load current flows. Accordingly, the comparator CMP1 and the positive and negative input terminals thereof must have a breakdown voltage that is higher than the supply voltage VBp. Presently, power supply systems of vehicles are mainly of 12 V. In this case, a maximum of the supply voltage VBp is about 18 V. To decrease a power loss due to a load current, increasing the supply voltage to 42 V is being studied. In this case, the main and reference semiconductor elements QA and QB and the driver 111 for driving them must have an increased breakdown voltage to meet the 42-V power supply system.

As already mentioned, it is advantageous in terms of costs and reliability if the conventional 12-V elements are employed for the control circuit even in a higher supply voltage environment. Based on studies of the 12-V power supply controller mentioned above, the semiconductor active fuses of the present invention have been developed. These will be explained in conjunction with the first and second embodiments.

FIRST EMBODIMENT

Figure 3:
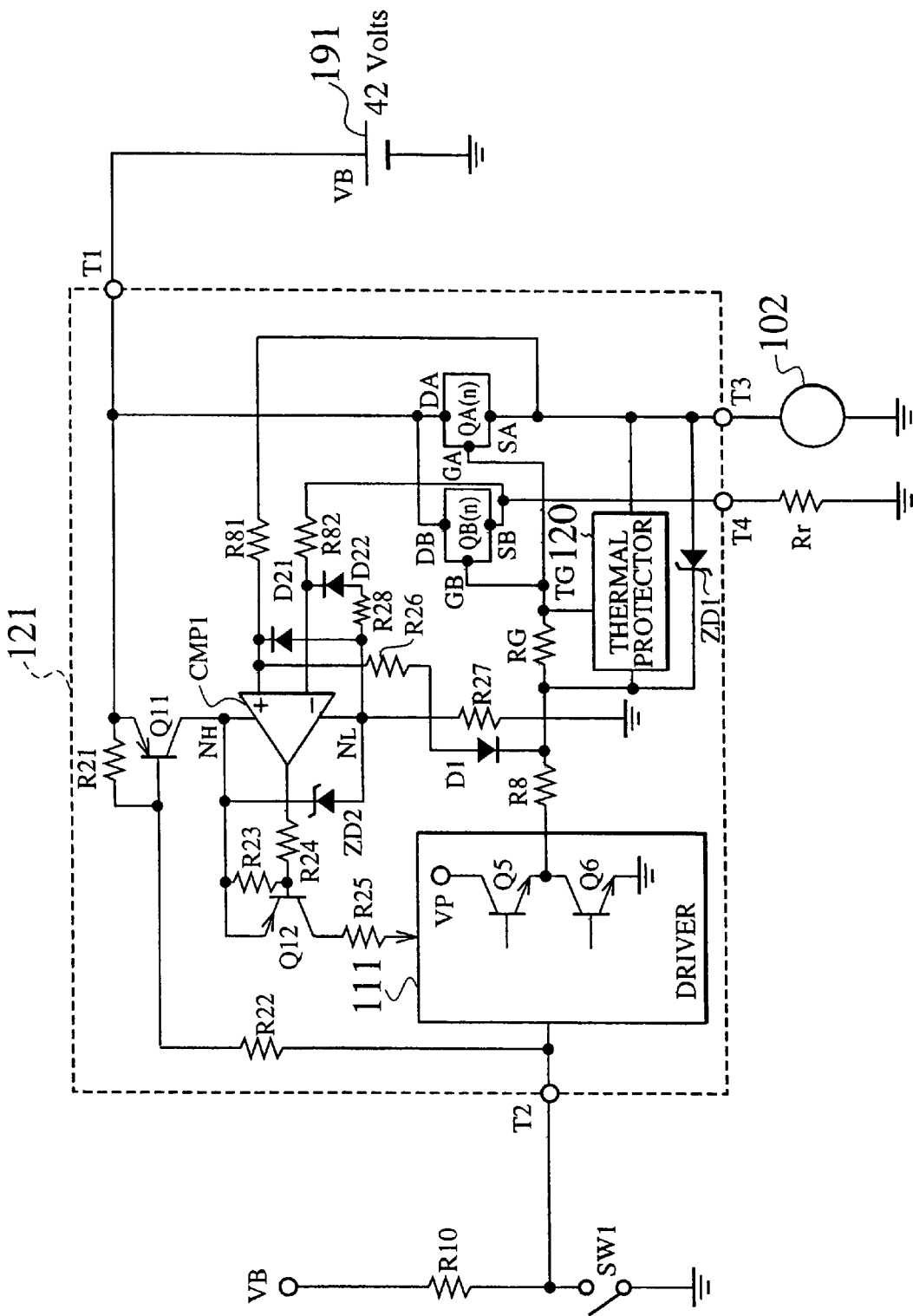
FIG. 3 is a circuit diagram showing a high-voltage semiconductor active fuse of n-channel configuration according to a first embodiment of the present invention.

FIG. 3 shows a high-voltage semiconductor active fuse according to the first embodiment of the present invention. Main components of the active fuse will be explained. An n-channel first semiconductor element QA(n) has a first main electrode DA connected to an external input terminal T1, a second main electrode SA connected to a first external output terminal T3, and a control electrode GA. An n-channel second semiconductor element QB(n) has a first main electrode DB connected to the input terminal T1, a second main electrode SB connected to a second external output terminal T4, and a control electrode GB connected to the control electrode GA of the n-channel first semiconductor element QA(n). A reference resistor Rr serves as a reference circuit and is connected to the second main electrode SB of the n-channel second semiconductor element QB(n) through the output terminal T4. A comparator CMP1 has a high-potential power supply terminal NH, a low-potential power supply terminal NL, a first input terminal connected to the second main electrode SA of the n-channel first semiconductor element QA(n), and a second input terminal connected to the second main electrode SB of the n-channel second semiconductor element QB(n). According to the output of the comparator CMP1, a driver 111 supplies a control voltage to the control electrodes GA and GB of the first and second semiconductor elements QA and QB. A first diode D21 is connected between the first input terminal and low-potential power supply terminal NL of the comparator CMP1. A second diode D22 is connected between the second input terminal and low-potential power supply terminal NL of the comparator CMP1 through a resistor R28. A load 102 is connected to the output terminal T3. If a current flowing through the load 102 exceeds a reference current set by the reference resistor Rr, the n-channel first semiconductor element QA(n) is turned on and off to cause current oscillations to break a conductive state between the input terminal T1 and the output terminal T3.

Although the embodiment employs the reference resistor Rr as a reference circuit, the reference circuit may be a constant current circuit, a parallel circuit of a resistor and a constant current circuit, or any other proper circuit. When the reference resistor Rr is employed, a value obtained by dividing the resistance of the reference resistor Rr by a current capacitance ratio n (n=1000 in this embodiment), i.e., Rr/n=Rr/1000 is compared with load resistance. When the load resistance becomes smaller than Rr/n, the n-channel first semiconductor element QA(n) is turned on and off. If the reference circuit is a constant current circuit for providing a constant current of $I_{ref}$, a current value obtained by multiplying $I_{ref}$ by the current capacitance ratio, i.e., $n \times I_{ref}$= $1000 \times I_{ref}$ is compared with a load current. When the load current exceeds $n \times I_{ref}$, the n-channel first semiconductor element QA(n) is turned on and off. If the reference circuit is a parallel circuit of a resistor and a constant current circuit, a combination of resistance and current reference values is used. One of these reference circuits is employed depending on a value that is used to detect an abnormality in the load 102.

Figure 4:
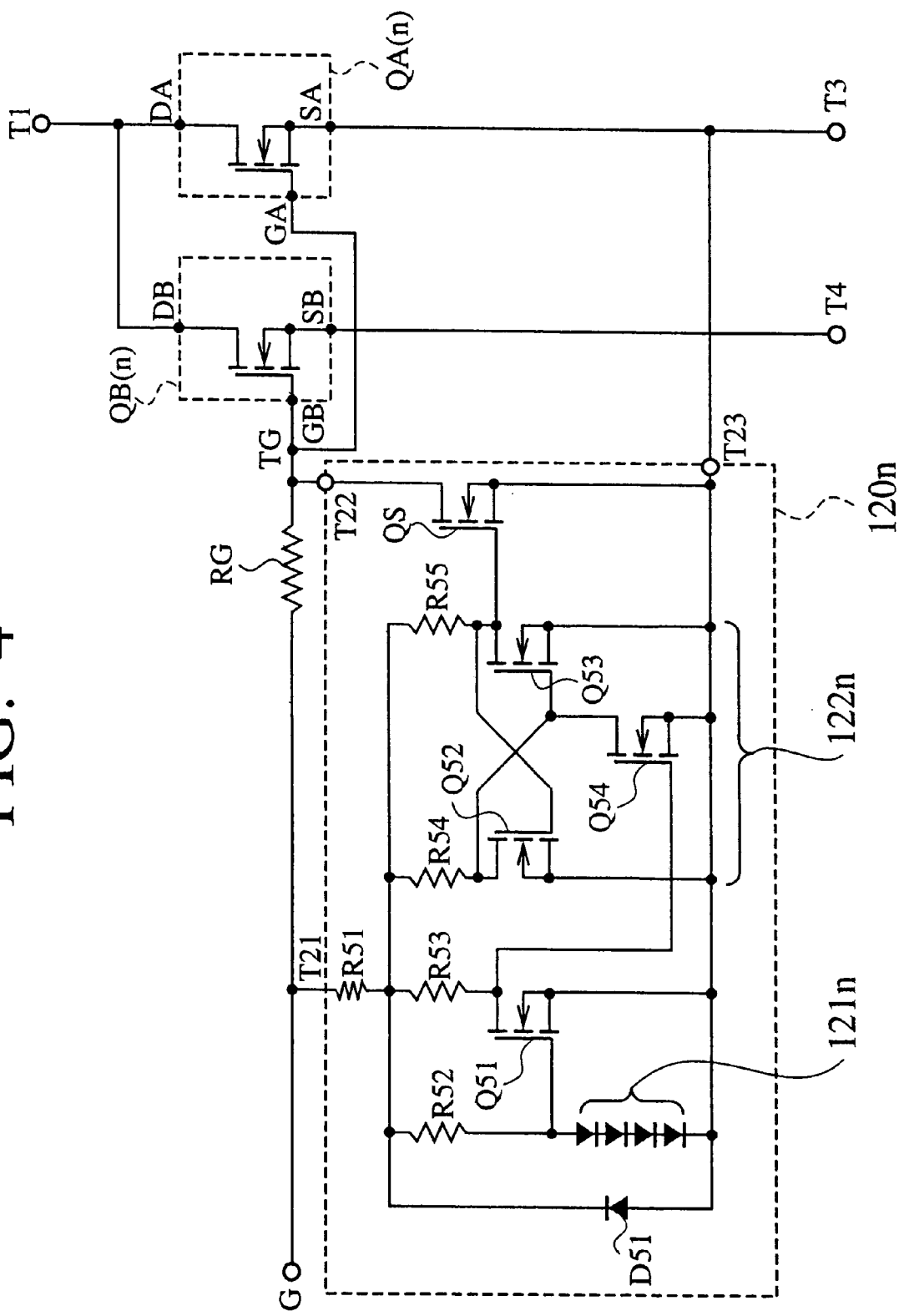
FIG. 4 is a circuit diagram showing a thermal protector merged in the semiconductor active fuse of the first embodiment.

FIG. 4 shows a n-channel thermal protector 120n connected between the gate electrode GA and source electrode SA of the n-channel first semiconductor element QA(n). If a technique of measuring the number of current oscillations is employed, a thermal protective function of the n-channel thermal protector 120n may be omitted. In FIG. 4, the n-channel thermal protector 120n has a thermal protection MOS transistor QS connected to the gate electrode GA of the n-channel first semiconductor element QA(n), a latch circuit 122n for supplying a signal to the gate electrode of the transistor QS, and a temperature sensor 121n for controlling the state of the latch circuit 122n. When detecting that the surface temperature of a semiconductor chip 121 is above a predetermined temperature, the temperature sensor 121n provides a signal to change the state of the latch circuit 122n. The latch circuit 122n holds the state and turns on the transistor QS, which short-circuits the gate electrode GA of the n-channel first semiconductor element QA(n) to the source electrode SA thereof, thereby forcibly turning off the n-channel first semiconductor element QA(n).

The temperature sensor 121n is made of series-connected four diodes that are made of polysilicon film and are integrated around the n-channel first semiconductor element QA(n). As the junction temperature of the n-channel first semiconductor element QA(n) increases, the surface temperature of the chip 121 increases to gradually decrease a forward voltage drop of each diode of the temperature sensor 121n. When the sum of the forward voltage drops of the four diodes decreases to make the gate potential of an nMOS transistor Q51 low, the nMOS transistor Q51 changes from ON to OFF state. As a result, the gate potential of an nMOS transistor Q54 is pulled up to the potential of a gate control terminal G for the n-channel first semiconductor element QA(n), to turn on the transistor Q54. This turns off an nMOS transistor Q53 and changes an nMOS transistor Q52 from OFF to ON state, so that the latch circuit 122n may latch "1." At this time, the output of the latch circuit 122n becomes high to change the transistor QS from OFF to ON state. Consequently, the true gate TG of the n-channel first semiconductor element QA(n) is short-circuited to the second main electrode (source electrode) SA thereof, to change the n-channel first semiconductor element QA(n) from ON to OFF state. Namely, the n-channel first semiconductor element QA(n) is turned off due to overheat.

As is apparent in FIG. 3, the high-voltage semiconductor active fuse of the first embodiment is a semiconductor integrated circuit (power IC) with the n-channel first semiconductor element QA(n) and the control circuit for it being integrated on the same substrate. The control circuit detects a current flowing through the load 102 connected to the n-channel first semiconductor element QA(n), and if the detected current is abnormal, turns on and off the n-channel first semiconductor element QA(n) to cause current oscillations to finally turn off the n-channel first semiconductor element QA(n). The substrate for forming the power IC may be an insulating substrate made of ceramics or glass epoxy, or an insulating metal substrate to form a hybrid IC. Preferably, the power IC is a monolithic power IC formed on the same semiconductor substrate (chip).

The n-channel first semiconductor element QA(n), may be an n-channel power MOS transistor of DMOS structure, VMOS structure, or UMOS structure, or an n-channel MOSSIT of like structure. Alternatively, the n-channel first semiconductor element QA(n) may be an n-channel MOS composite device such as an EST or a MOS controlled thyristor (MCT). Instead, the n-channel first semiconductor element QA(n) may be an n-channel insulated gate power device such as an n-channel IGBT. If the gate of the n-channel first semiconductor element QA(n) is always reversely biased, the n-channel first semiconductor element QA(n) may be an n-channel junction MOS transistor, an n-channel junction SIT, or an n-channel static induction (SI) thyristor. Of course, the first semiconductor element QA may be of any one of n- and p-channel types. Namely, the semiconductor active fuse of the present invention is of any one of n- and p-channel types. In the explanation of the first embodiment, the active fuse is the n-channel semiconductor active fuse serving as the high-side semiconductor element. A p-channel semiconductor active fuse serving as the high-side semiconductor element will be explained in the second embodiment of the present invention.

The n-channel first semiconductor element QA(n) may be a multichannel power device made of n-channel unit cells connected in parallel with one another. The n-channel first semiconductor element QA(n) is connected to the n-channel second semiconductor element QB(n) in parallel with and adjacent to each other. The n-channel second semiconductor element QB(n) may have no n-channel thermal protector 120n. The n-channel first and second semiconductor elements QA(n) and QB(n) are manufactured in the same process in the vicinity of each other, so that there will be no electric characteristic variations between the n-channel semiconductor elements QA(n) and QB(n) due to temperature drift or lot difference. The current handling capability of the n-channel second semiconductor element QB(n) is set to be smaller than that of the n-channel first semiconductor element QA(n) by adjusting the number of unit cells that form the n-channel second semiconductor element QB(n). For example, the n-channel second semiconductor element QB(n) consists of one unit cell and the n-channel first semiconductor element QA(n) consists of 1000 unit cells. The temperature sensor 121n consists of series-connected diodes made of a polysilicon thin film that is deposited on an interlayer insulating film formed on the n-channel first and second semiconductor elements QA(n) and QB(n). The temperature sensor 121n is integrated adjacent to a channel region of the n-channel first semiconductor element QA(n).

Figure 5:
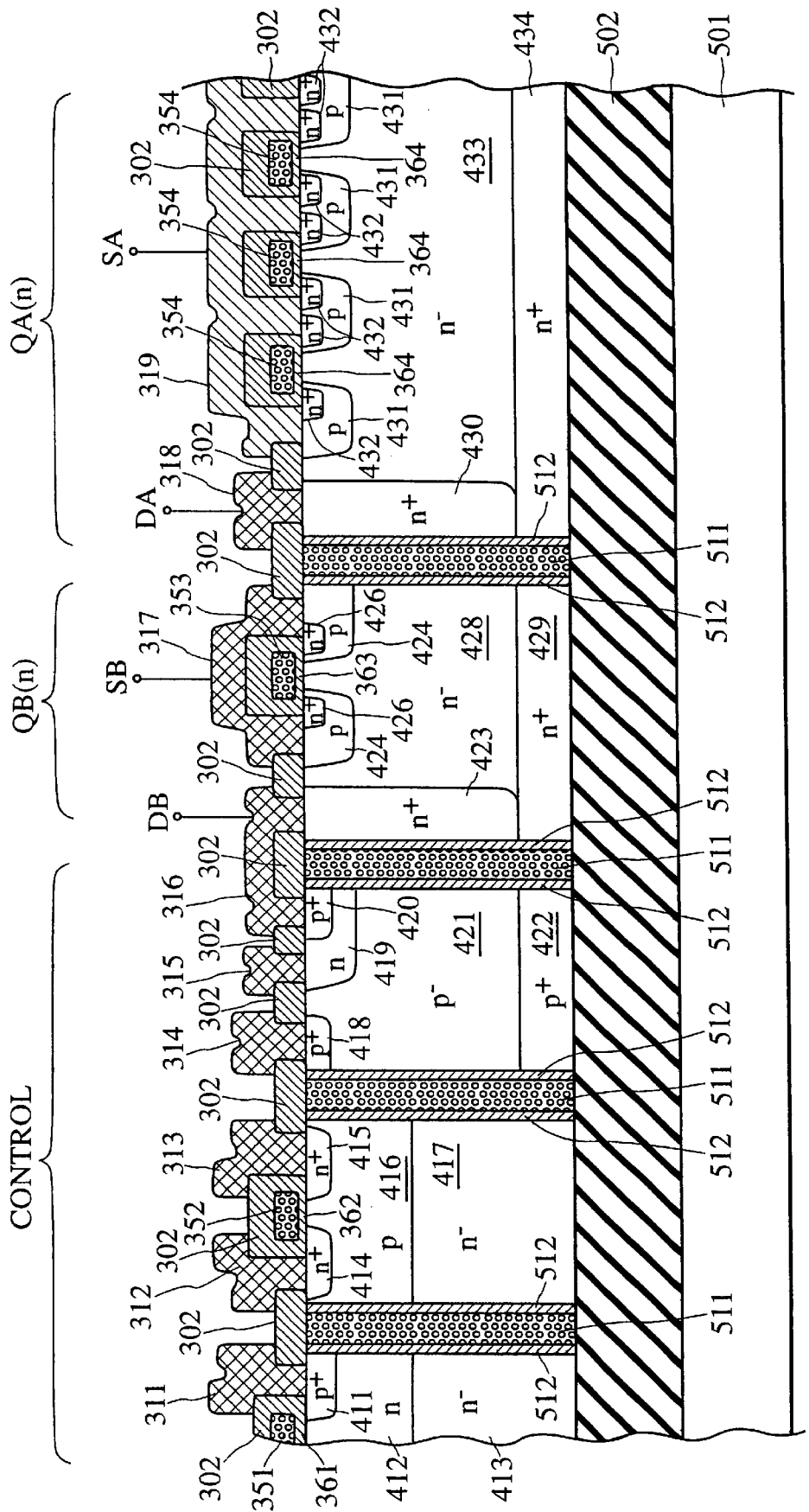
FIG. 5 is a schematic sectional view showing a part of structure of a power IC serving as the semiconductor active fuse of the first embodiment.

FIG. 5 is a cross-sectional view showing an example in which the semiconductor active fuse of the first embodiment shown in FIG. 3 is monolithically integrated on a single semiconductor chip. As shown in FIG. 5, the semiconductor active fuse of the first embodiment includes a silicon-on insulator (SOI) oxide films (i.e. buried insulating films) 502 to form an SOI structure. In the dielectrically isolated (DI) structure utilizing the SOI structure, the first semiconductor element QA(n), the second semiconductor element QB(n), each of the circuit elements of the control circuits for controlling the first semiconductor element QA(n) and the second semiconductor element QB(n), are electrically isolated by dielectric isolation region. That is, between the first semiconductor element QA(n) and the second semiconductor element QB(n), a region for isolating their unit cells from each other is formed. The dielectric isolation region is formed so deep as to reach the SOI oxide film 502. That is, the dielectric isolation region is formed with a trench sidewall insulating film 512, formed on the sidewall of trench, and a semi-insulating poly-silicon (SIPOS) 511 interposed between the trench sidewall insulating films 512. Similarly, on the control circuit side, the dielectric isolation regions are formed with trenches, which extend so deep as to reach the SOI oxide film 502.

As described above, the first semiconductor element QA(n) is formed with unit cells in the number of N1 arranged in parallel with each other formed above the SOI oxide film 502. The second semiconductor element QB(n), formed with the same unit cell as of the first semiconductor element QA(n), only in the number N2=1, also has the same structure of vertical power device formed above the SOI oxide film 502. The first semiconductor element QA(n) has the structure where the $n^+$ buried drain region 434 is formed on the SOI oxide film 502, and the n-drift region 433 is formed thereon. From the top of the n-drift region 433, an $n^+$ sinker region 430 is formed to reach the $n^+$ buried drain region 434. The first semiconductor element QA(n) shown in FIG. 5 further includes island-shaped p-body regions 431 facing each other on the surface of the drift region 433. On the surface of the p-body regions 431, $n^+$ regions 432 serving as the source regions are formed. As in the case of the p-body region 431, each of the $n^+$ regions 432 also may be joined to each other in the portion invisible in FIG. 5, and may have a planar shape of circle or rectangular ring (i.e. a donut). On the p-body regions 431 and the drift region 433 surrounded by the p-body region 431, gate insulating films 364 are formed, and on the gate insulating films 364, gate electrodes 354 are formed. On the gate electrodes 354, an interlayer dielectric film 302 is formed. In the interlayer dielectric film 302, contact holes are formed, and a source electrode (SA) 319 is formed in such a manner that the p body regions 431 and the source regions 432 are short-circuited through the contact holes. And a drain electrode (DA) 318 is formed to be contacted with the n⁺ sinker region 430 through the contact hole.

Similarly, the second semiconductor element QB(n) is formed with the n⁺ buried drain region 429 and n-drift region 428 which are formed above the SOI oxide film 502. An island-shaped p-body region 424 is formed on the surface of the n-drift region 428. From the top of the n-drift region 428, an n+sinker region 423 is formed to reach the n⁺ buried drain region 429. On the surface of the p-body region 424, an n⁺ region 426 serving as the source region is formed. On the p-body region 424 and the area of the drift region 428 surrounded by the p-body region 424, a gate insulating film 363 is formed. On the gate insulating film 363, a gate electrode 353 is formed. The gate electrode 353 is connected to the gate electrode 354. On the gate electrode 353, an interlayer dielectric film 302 is formed, and a contact hole is formed therein. A source electrode (SB) 317 is formed in such a manner that the p-body region 424 and the source region 426 are short-circuited through the contact hole. And a drain electrode (DB) 316 is formed to be contacted with the n⁺ sinker region 423 through the contact hole. As shown in FIG. 3, the source electrode (SB) 317 is connected to the reference resistor Rr of polysilicon mounted on the surface of the semiconductor chip.

On the control circuit side in FIG. 5, the nMOS transistor formed on the p-well 416, and an p-n-p bipolar transistor formed on the p⁺ buried collector region 422 are schematically shown. That is, on the SOI oxide film 502, an n-region 417 is formed, and on the n-region 417, a p-well 416 is formed. And in the p-well 416, the n⁺ source region 414 and the n⁺ drain region 415 are formed. On the region of the p-well 416 interposed between the n⁺ source region 414 and the n⁺ drain region 415, a gate insulating film 362 is formed. On the gate insulating film 362, a gate electrode 352 is formed. To the n⁺ source region 414 and n⁺ drain region 415 respectively, a source electrode 312 and a drain electrode 313 are connected via the contact hole formed in the layer insulating film 302. On the SOI oxide film 502, an p⁺ buried collector region 422 is formed. On the p⁺ buried collector region 422, an p-drift region 421 is formed. On the surface of the p drift region 421, an n-base region 419 is formed. In the p-base region 419, an p⁺ emitter region 420 is formed. On the surface of the n-drift region 421, p⁺ collector contact region 418 is formed at the position apart from the p-base region 419. To the p⁺ emitter region 420, the n-base region 419, and the p⁺ collector contact region 418 respectively, an emitter electrode 316, a base electrode 315, and a collector electrode 314 are connected via the contact hole formed in the interlayer dielectric film 302. The emitter electrode 316 continues to the drain electrode (DB) of the second semiconductor element QB(n). A pMOS transistor formed next to the nMOS transistor. That is, on the SOI oxide film 502, an n-region 413 is formed, and on the n-region 413, a n-well 412 is formed. And in the n-well 412, a p⁺ source region (not shown in FIG. 5) and the p⁺ drain region 411 are formed. On the region of the n-well 412 interposed between the p⁺ source region and the p⁺ drain region 411, a gate insulating film 361 is formed. On the gate insulating film 361, a gate electrode 351 is formed. To the p⁺ source region and p⁺ drain region 411 respectively, a source electrode (not shown in FIG. 5) and a drain electrode 311 are connected via the contact hole formed in the layer insulating film 302.

The operation of the semiconductor active fuse of the first embodiment will be explained with reference to FIG. 3.

When an operation switch SW1 outside the semiconductor chip 121 is closed, an ON signal is supplied to the driver 111 through an input terminal T2. As a result, a voltage VP stepped up by a charge pump (not shown) is passed through resistors R8 and RG to the gates TG of the n-channel first and second semiconductor elements QA(n) and QB(n), to turn on the n-channel first and second semiconductor elements QA(n) and QB(n). The voltage VP is, for example, VB+10 V where VB is a power supply voltage.

Each MOS transistor serving as the unit cell of each of the n-channel first and second semiconductor elements QA(n) and QB(n) has an ON resistance value of $R_{fet}$, and the n-channel first and second semiconductor elements QA(n) and QB(n) have ON resistance values of $R_{onA}$ and $R_{onB}$, respectively. In an ohmic region where the n-channel first and second semiconductor elements QA(n) and QB(n) are completely ON, the expressions (1) and (3) mentioned above are established. The ON resistance $R_{onA}$ is usually about 30 mΩ, and therefore, $R_{onB}$=30Ω with Rr=8.4 kΩ. Assuming that the n-channel first and second semiconductor elements QA(n) and QB(n) have drain currents $I_{DA}$ and $I_{DB}$, respectively, and that the supply voltage VB is 42 V, the following is established:

$$I_{DB} = 42 \,[V]/(R_{onB} + Rr) \tag{11}$$

$$\approx 42\,[V]/Rr$$

$$= 42\,[V]/8.4\,[k\Omega]$$

$$= 5\,[mA]$$

Assuming that the n-channel first and second semiconductor elements QA(n) and QB(n) have drain-source voltages of $V_{DSA}$ and $V_{DSB}$, respectively, the expressions (5) to (7) mentioned above are established.

If $I_{DA}$=5[A], then $V_{DSB}$=$V_{DSA}$. If $I_{DA}$<5[A], then $V_{DSA}$<$V_{DSB}$. If $I_{DA}$>5[A], then $V_{DSA}$>$V_{DSB}$.

When the switch SW1 is closed, the pnp transistor Q11 shown in FIG. 3 turns on to apply the supply voltage to the high-potential power supply terminal NH of the comparator CMP1. The low-potential power supply terminal NL of the comparator CMP1 is grounded through the resistor R27. A Zener diode ZD2 is connected between the terminals NH and NL. If a Zener voltage of the Zener diode ZD2 is 12 V, the voltage between the terminals NH and NL is 12 V, which is lower than the supply voltage VB of 42 V. The potential VNL of the low-potential power supply terminal NL is kept as follows:

$$VB-V_{on11}-12[V]=VB-12.3[V] \tag{12}$$

where $V_{on11}$ is an ON voltage of the transistor Q11.

If the drain current $I_{DA}$ of the n-channel first semiconductor element QA(n) is smaller than 5 A, then $V_{DSA}$<$V_{DSB}$. As a result, the output of the comparator CMP1 becomes high to turn off the pnp transistor Q12, and the driver 111 keeps the n-channel first and second semiconductor elements QA(n) and QB(n) on. If the drain current $I_{DA}$ of the n-channel first semiconductor element QA(n) exceeds 5 A, then $V_{DSA}$>$V_{DSB}$, to make the output of the comparator CMP1 low and the pnp transistor Q12 on. As a result, a source transistor Q5 of the driver 111 turns off to turn on a sink transistor Q6 thereof Then, the gates of the n-channel first and second semiconductor elements QA(n) and QB(n) are grounded through resistors RG and R8. Namely, the n-channel first and second semiconductor elements QA(n) and QB(n) are turned off. The current value of 5 A is an overcurrent determination value when the supply voltage VB is 42 V. At this time, the resistance of the load 102 is 42 V/5 A=8.4Ω, which is equal to n×Rr=1000×8.4 mΩ. The resistance value of 8.4Ω is an overload determination value. If a load resistance below 8.4Ω is detected, the n-channel first and second semiconductor elements QA(n) and QB(n) are turned off. The overload determination value of 8.4Ω is constant irrespective of the supply voltage VB because the reference circuit is a resistor. If the reference circuit is a constant current circuit, an overcurrent determination value is constant irrespective of the supply voltage VB.

After the n-channel first and second semiconductor elements QA(n) and QB(n) are turned off, the drain-source voltages $V_{DSA}$ and $V_{DSB}$ of the n-channel first and second semiconductor elements QA(n) and QB(n) increase, and the source potentials $V_{SA}$ and $V_{SB}$ of the n-channel first and second semiconductor elements QA(n) and QB(n) decrease toward a ground potential GND. The sink transistor Q6 of the driver 111 turns on to pass a current from the source of the semiconductor element QA through a resistor R81, a resistor R26, a diode D1, the resistor R8, and the sink transistor Q6 to the ground GND. This produces a hysteresis effect to drop the potential of the positive input terminal of the comparator CMP1, and therefore, the output of the comparator CMP1 is stabilized at low. As the source potentials $V_{SA}$ and $V_{SB}$ decrease, the potentials of the input terminals of the comparator CMP1 decrease. However, the potential of the positive input terminal of the comparator CMP1 is clamped by the potential VNL of the low-potential power supply terminal and the diode D21 and does not drop below VNL−0.7 V (a forward voltage drop of the diode D21). Since VNL=VB−12.3 V, the potential of the positive input terminal of the comparator CMP1 does not drop below VB−13 V. The negative input terminal of the comparator CMP1 is also clamped by the diode D22. Since it is clamped through the resistor R28, the negative input terminal of the comparator CMP1 is clamped at a value that is lower than the potential of the positive input terminal of the comparator CMP1 by a voltage drop of the resistor R28. Namely, the clamp potential of the negative input terminal is equal to "VB−13 V-(the voltage drop of the resistor R28)." When the source potentials $V_{SA}$ and $V_{SB}$ of the n-channel first and second semiconductor elements QA(n) and QB(n) decrease to apply clamped voltages to the comparator CMP1, the output of the comparator CMP1 becomes high irrespective of the state of the load side. As a result, the driver 111 again turns on the n-channel first and second semiconductor elements QA(n) and QB(n). When the source potentials $V_{SA}$ and $V_{SB}$ become lower than the clamped voltages, the n-channel first and second semiconductor elements QA(n) and QB(n) are turned on after a delay time of the control circuit and MOS transistors. When the source potentials $V_{SA}$ and $V_{SB}$ become higher than the clamped voltages, the n-channel first and second semiconductor elements QA(n) and QB(n) are turned off after the delay time of the control circuit and MOS transistors, thereby alternately turning on and off the n-channel first and second semiconductor elements QA(n) and QB(n). After the continuation of the ON/OFF operations for a predetermined period, the n-channel first and second semiconductor elements QA(n) and QB(n) are entirely turned off through the thermal protective operation of the n-channel first semiconductor element QA(n), or a timer process.

SECOND EMBODIMENT

Figure 6:
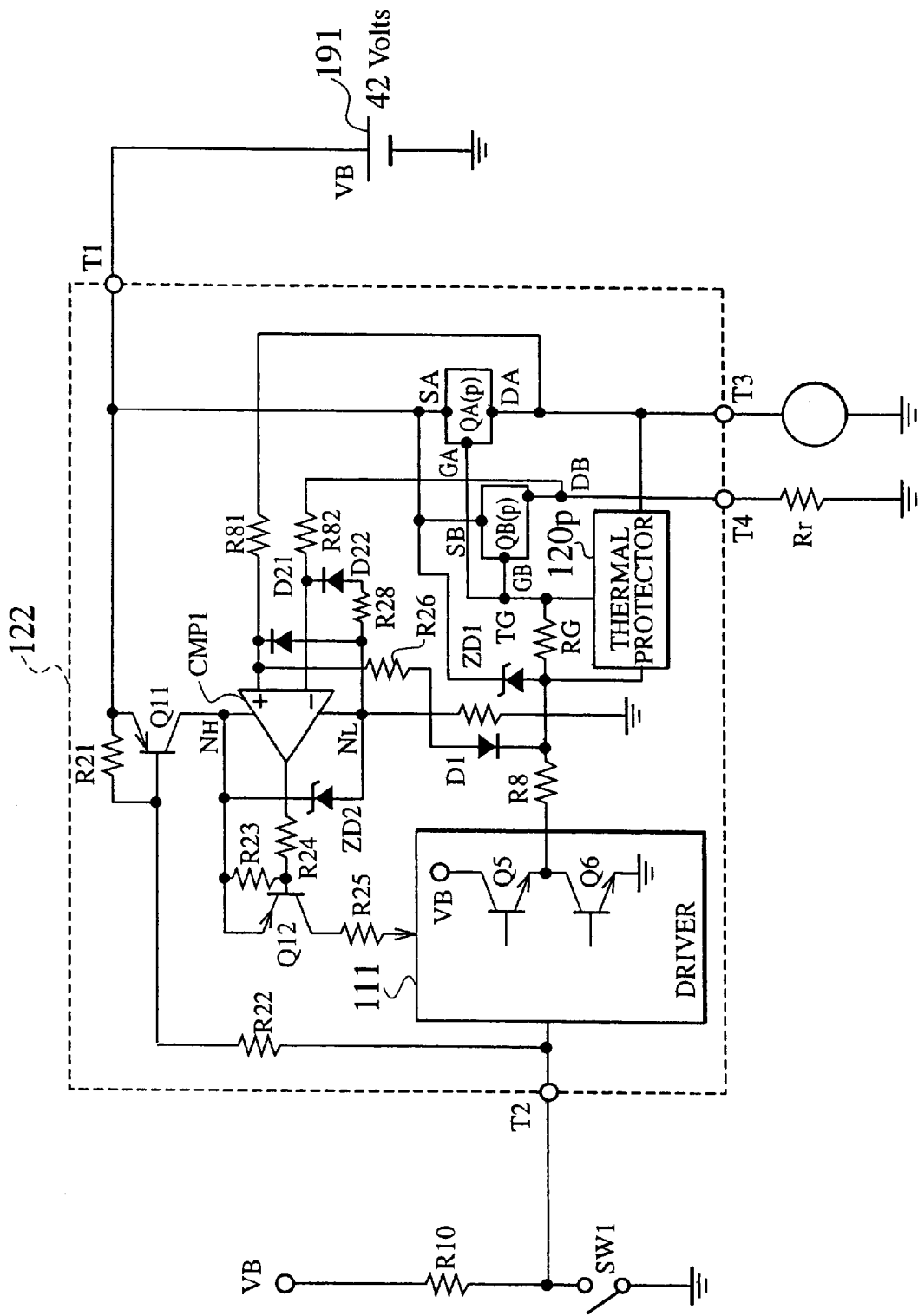
FIG. 6 is a circuit diagram showing a high-voltage semiconductor active fuse of p-channel configuration according to a second embodiment of the present invention.

As mentioned above, the high-voltage semiconductor active fuse of the first embodiment is the n-channel high-side circuit. The second embodiment provides the semiconductor active fuse that is the p-channel high-side circuit as shown in FIG. 6. The p-channel high-side circuit consists of a p-channel first semiconductor element QA(p) and a p-channel second semiconductor element QB(p) and has substantially the same structure as the n-channel semiconductor fuse of the first embodiment of FIG. 3, except for the conductivity type and the related polarity.

Figure 7:
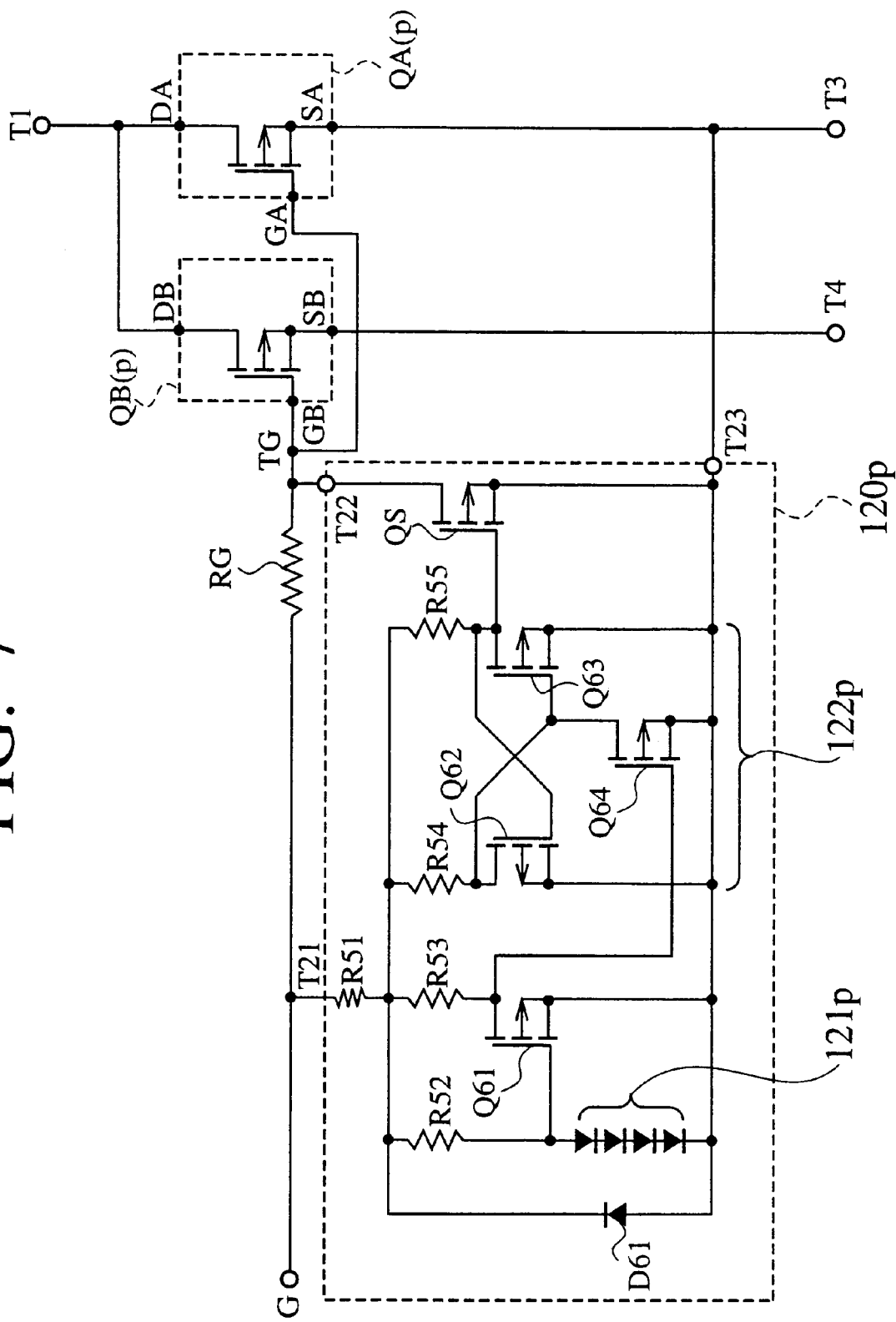
FIG. 7 is a circuit diagram showing a thermal protector merged in the semiconductor active fuse of the second embodiment.

FIG. 7 is a circuit diagram showing a p-channel thermal protector 120p integrated in the p-channel semiconductor active fuse of the second embodiment. The p-channel thermal protector 120p is connected between the gate electrode GA and source electrode SA of the p-channel first semiconductor element QA(p). If the technique and circuit configuration for counting the number of current oscillations are employed, the thermal protective function provided by the p-channel thermal protector 120p may be omitted, like the first embodiment. The p-channel thermal protector 120p consists of a p-channel thermal protection MOS transistor QS connected to the gate electrode GA of the p-channel first semiconductor element QA(p), a latch circuit 122p for supplying a signal to the gate electrode of the transistor QS, and a temperature sensor 121p for controlling the state of the latch circuit 122p. If the temperature sensor 121p detects that the surface temperature of a semiconductor chip 122 is above a predetermined temperature, the temperature sensor 121p provides a signal to change the state of the latch circuit 122p, which keeps the changed state. This turns on the transistor QS to short-circuit the gate electrode GA and source electrode SA of the p-channel first semiconductor element QA(p) to each other, thereby forcibly turning off the p-channel first semiconductor element QA(p).

The temperature sensor 121p consists of series-connected four diodes made of, for example, polysilicon film. The temperature sensor 121p is integrated in the vicinity of the p-channel first semiconductor element QA(p). As the junction temperature of the p-channel first semiconductor element QA(p) increases, the surface temperature of the semiconductor chip 122 increases to gradually decrease a forward voltage drop of each diode of the temperature sensor 121p. When the sum of the forward voltage drops of the four diodes decreases to make the gate potential of a pMOS transistor Q61 to high, the PMOS transistor Q61 changes from ON to OFF state. As a result, the gate potential of a PMOS transistor Q64 is pulled down to the potential of a gate control terminal G for the p-channel first semiconductor element QA(p), to turn on the pMOS transistor Q64. This turns off a pMOS transistor Q63 and a pMOS transistor Q62 on. Then, the latch circuit 122p latches "1." At this time, the output of the latch circuit 122p becomes high to turn on the transistor QS to short-circuit the true gate TG and second main electrode (source electrode) SA of the p-channel first semiconductor element QA(p) to each other. In this way, the p-channel first semiconductor element QA(p) is turned off due to overheat.

OTHER EMBODIMENTS

Figure 8:
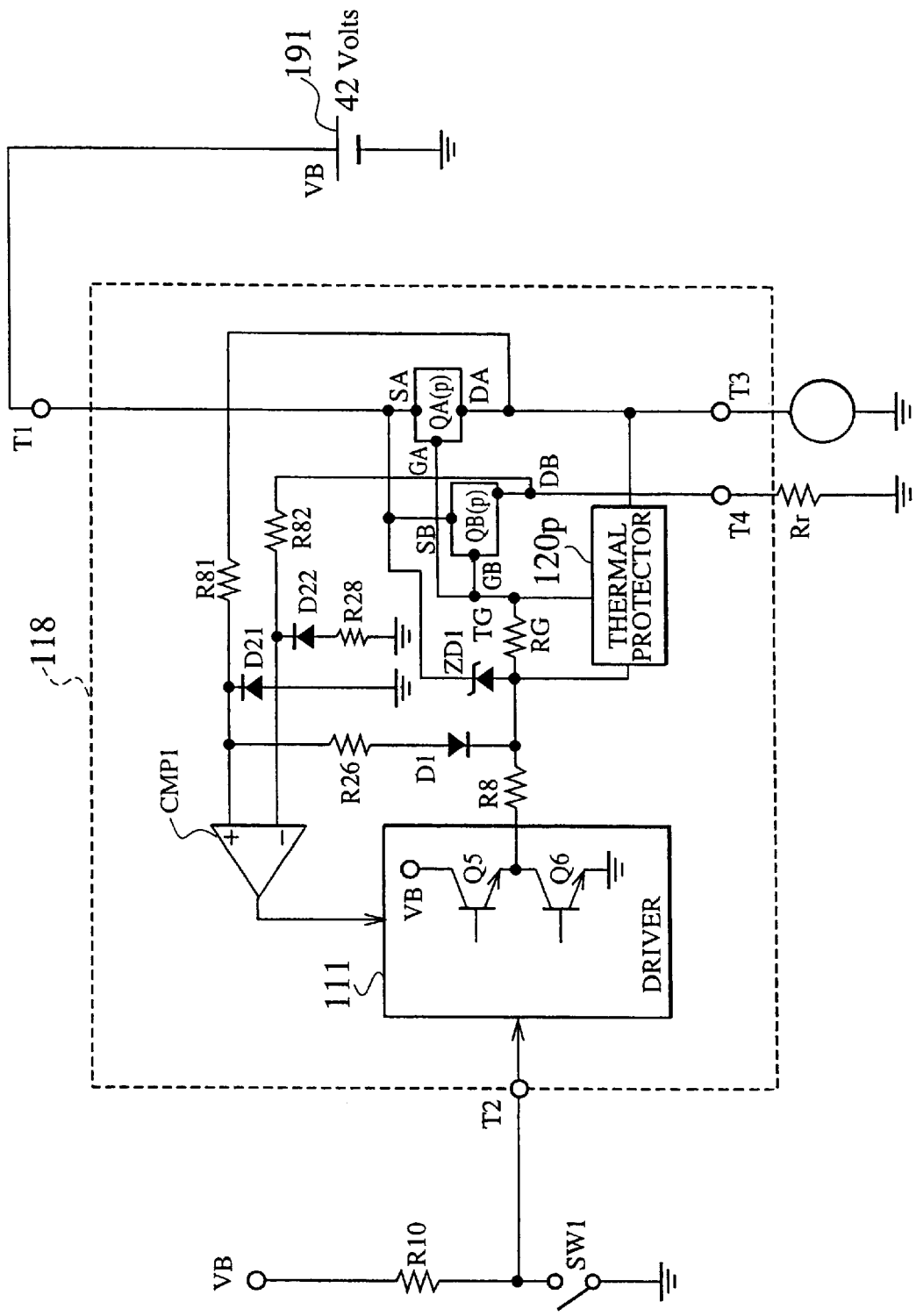
FIG. 8 is a circuit diagram showing a high-voltage semiconductor active fuse of p-channel configuration according to another embodiment of the present invention.

Various modifications will become possible for those skilled in the art after receiving the teachings of the present disclosure without departing from the scope thereof. For example, under a certain condition, a Zener diode ZD2 of the high-voltage semiconductor active fuse of the second embodiment of FIG. 6 may be omitted as shown in FIG. 8.

Similarly, the Zener diode ZD2 of the high-voltage semiconductor active fuse of the first embodiment of FIG. 3 may be omitted.

In this way, the present invention may involve various embodiments not mentioned here. The scope of the present invention, therefore, is determined only by claims mentioned below in conjunction with the descriptions mentioned above.

What is claimed is:

1. A semiconductor active fuse comprising:

a first semiconductor element having a first main electrode connected to a DC power supply outputting supply voltage higher than 12V, a second main electrode connected to a load, and a control electrode;

a second semiconductor element having a first main electrode connected to the first main electrode of the first semiconductor element, a second main electrode connected to a reference circuit, and a control electrode connected to the control electrode of the first semiconductor element;

a comparator having a high-potential power supply terminal, a low-potential power supply terminal, a first input terminal electrically coupled to the second main electrode of the first semiconductor element, and a second input terminal electrically coupled to the second main electrode of the second semiconductor element;

a driver for supplying a control voltage to the control electrodes of the first and second semiconductor elements according to the output of the comparator;

a first diode having a first cathode connected to the first input terminal and a first anode connected to the low-potential power supply terminal;

a second diode having a second cathode connected to the second input terminal and a second anode; and a resistor having one end connected only to the second anode and the other end connected both to the first anode and to the low-potential power supply terminal, wherein, if an overcurrent that is above a reference current determined by the reference circuit flows through the first semiconductor element, the semiconductor active fuse turns on and off the first semiconductor element to produce current oscillations that cut off a conductive state of the first semiconductor element.

2. The semiconductor active fuse of claim 1, wherein:

the first semiconductor element consists of N1 unit cells and the second semiconductor element consists of N2 unit cells where N1>>N2.

3. A semiconductor active fuse comprising:

a first semiconductor element having a first main electrode connected to a DC power supply, a second main electrode connected to a load, and a control electrode;

a second semiconductor element having a first main electrode connected to the first main electrode of the first semiconductor element, a second main electrode connected to a reference circuit, and a control electrode connected to the control electrode of the first semiconductor element;

a comparator having a high-potential power supply terminal, a low-potential power supply terminal, a first input terminal electrically coupled to the second main electrode of the first semiconductor element, and a second input terminal electrically coupled to the second main electrode of the second semiconductor element;

a driver for supplying a control voltage to the control electrodes of the first and second semiconductor elements according to the output of the comparator;

a first diode connected between the first input terminal and the low-potential power supply terminal;

a second diode connected between the second input terminal and the low-potential power supply terminal through a resistor; and a constant-voltage diode connected between the high-potential power supply terminal and the low-potential power supply terminal, wherein, if an overcurrent that is above a reference current determined by the reference circuit flows through the first semiconductor element, the semiconductor active fuse turns on and off the first semiconductor element to produce current oscillations that cut off a conductive state of the first semiconductor element.

4. A semiconductor active fuse comprising:

a first semiconductor element having a first main electrode connected to a DC power supply, a second main electrode connected to a load, and a control electrode;

a second semiconductor element having a first main electrode connected to the first main electrode of the first semiconductor element, a second main electrode connected to a reference circuit, and a control electrode connected to the control electrode of the first semiconductor element;

a comparator having a high-potential power supply terminal, a low-potential power supply terminal, a first input terminal electrically coupled to the second main electrode of the first semiconductor element, and a second input terminal electrically coupled to the second main electrode of the second semiconductor element;

a driver for supplying a control voltage to the control electrodes of the first and second semiconductor elements according to the output of the comparator;

a first diode connected between the first input terminal and the low-potential power supply terminal;

a second diode connected between the second input terminal and the low-potential power supply terminal through a resistor; and a third semiconductor element connected between the DC power supply and the high-potential power supply terminal, wherein, if an overcurrent that is above a reference current determined by the reference circuit flows through the first semiconductor element, the semiconductor active fuse turns on and off the first semiconductor element to produce current oscillations that cut off a conductive state of the first semiconductor element.

5. The semiconductor active fuse of claim 1, wherein:

the first and second semiconductor elements, comparator, driver, and first and second diodes are integrated on a same semiconductor substrate.

6. The semiconductor active fuse of claim 3, wherein the DC power supply outputs the supply voltage of 42 V.

7. The semiconductor active fuse of claim 3, wherein:

the first semiconductor element consists of N1 unit cells and the second semiconductor element consists of N2 unit cells where N1>>N2.

8. The semiconductor active fuse of claim 4, wherein:

the first semiconductor element consists of N1 unit cells and the second semiconductor element consists of N2 unit cells where N1>>N2.

9. The semiconductor active fuse of claim 3, wherein:

the first and second semiconductor elements, comparator, driver, and first and second diodes are integrated on a same semiconductor substrate.

10. The semiconductor active fuse of claim 4, wherein:

the first and second semiconductor elements, comparator, driver, and first and second diodes are integrated on a same semiconductor substrate.

* * * * *